US012599860B2

(12) United States Patent　　　(10) Patent No.:　US 12,599,860 B2
Mahawili　　　　　　　　　　　　(45) Date of Patent:　Apr. 14, 2026

(54) LIQUID FILTER APPARATUS WITH THERMAL SHIELD

(71) Applicant: EDWARDS VACUUM LLC, Sanborn, NY (US)

(72) Inventor: Imad Mahawili, Roseville, CA (US)

(73) Assignee: EDWARDS VACUUM LLC, Sanborn, NY (US)

( * ) Notice: Subject to any disclaimer, the term of this patent is extended or adjusted under 35 U.S.C. 154(b) by 937 days.

(21) Appl. No.: 17/527,643

(22) Filed: Nov. 16, 2021

(65) Prior Publication Data

US 2023/0149841 A1　　May 18, 2023

(51) Int. Cl.
*B01D 45/02*　　(2006.01)
*B01D 47/02*　　(2006.01)
*B01D 50/40*　　(2022.01)
*C23C 16/44*　　(2006.01)

(52) U.S. Cl.
CPC ........... *B01D 45/02* (2013.01); *B01D 47/021* (2013.01); *B01D 47/024* (2013.01); *B01D 47/025* (2013.01); *B01D 50/40* (2022.01); *C23C 16/4412* (2013.01); *B01D 2258/0216* (2013.01)

(58) Field of Classification Search
None
See application file for complete search history.

(56) References Cited

U.S. PATENT DOCUMENTS

| | | | | | |
|---|---|---|---|---|---|
| 3,289,398 | A | * | 12/1966 | McIlvaine | ............ B01D 47/024 |
| | | | | | 55/440 |
| 3,756,580 | A | * | 9/1973 | Dunn | ................... B01D 47/021 |
| | | | | | 96/353 |
| 4,116,647 | A | * | 9/1978 | Garner | ................. B01D 47/024 |
| | | | | | 96/275 |
| 4,172,865 | A | * | 10/1979 | Steier | ................... B01D 47/021 |
| | | | | | 261/119.1 |
| 4,211,249 | A | | 7/1980 | Richards | |
| 4,300,924 | A | * | 11/1981 | Coyle | ................. B01D 47/025 |
| | | | | | 96/330 |

(Continued)

FOREIGN PATENT DOCUMENTS

| | | |
|---|---|---|
| CN | 2633410 Y | 8/2004 |
| CN | 104771979 A | 7/2015 |

(Continued)

OTHER PUBLICATIONS

Translation of KR101489119B1, accessed Jan. 15, 2025 (Year: 2015).*

(Continued)

*Primary Examiner* — Jennifer Dieterle
*Assistant Examiner* — Phillip Y Shao
(74) *Attorney, Agent, or Firm* — Gardner, Linn, Burkhart & Ondersma LLP

(57)　　　　　　　ABSTRACT

A liquid filter apparatus for gas/solid separation includes a housing with a filter chamber, a semiconductor process gas inlet, and a process gas outlet. The filter chamber forms a liquid reservoir, and the semiconductor process gas inlet and the process gas outlet are in communication with the filter chamber. The housing further includes a filter liquid inlet and a filter liquid outlet, which are in communication with the liquid reservoir for delivering and removing filter fluid, respectively, to and from the liquid reservoir.

21 Claims, 12 Drawing Sheets

(56)        References Cited

U.S. PATENT DOCUMENTS

| | | | | | |
|---|---|---|---|---|---|
| 5,061,299 | A | * | 10/1991 | Porter, III | ........... B01D 47/021 |
| | | | | | 96/306 |
| 5,427,610 | A | | 6/1995 | Croker | |
| 5,616,208 | A | | 4/1997 | Lee | |
| 5,759,237 | A | | 6/1998 | Li et al. | |
| 5,762,663 | A | * | 6/1998 | Asada | ................. B01D 47/024 |
| | | | | | 96/336 |
| 6,039,060 | A | | 3/2000 | Rower | |
| 6,132,493 | A | * | 10/2000 | Church | ................. B01D 50/40 |
| | | | | | 95/218 |
| 6,325,361 | B1 | | 12/2001 | Van Duijn | |
| 6,370,911 | B1 | | 4/2002 | Zhou et al. | |
| 6,391,100 | B1 | | 5/2002 | Hogan | |
| 6,616,733 | B1 | * | 9/2003 | Pellegrin | .............. B01D 47/021 |
| | | | | | 96/279 |
| 6,673,323 | B1 | | 1/2004 | Bhatnagar et al. | |
| 7,033,547 | B1 | * | 4/2006 | Ichikawa | ............ B01D 47/021 |
| | | | | | 423/239.1 |
| 10,302,553 | B2 | | 5/2019 | Siladie et al. | |
| 10,685,818 | B2 | | 6/2020 | Dickinson | |
| 2001/0024887 | A1 | | 9/2001 | Graves et al. | |
| 2001/0048902 | A1 | | 12/2001 | Hertzler et al. | |
| 2002/0081240 | A1 | | 6/2002 | Kim | |
| 2002/0192129 | A1 | | 12/2002 | Shamouilian et al. | |
| 2005/0196330 | A1 | | 9/2005 | Garnett | |
| 2006/0107838 | A1 | | 5/2006 | Meier et al. | |
| 2008/0276801 | A1 | | 11/2008 | Bell et al. | |
| 2010/0071548 | A1 | | 3/2010 | Smith | |
| 2010/0155222 | A1 | | 6/2010 | Rostaing et al. | |
| 2011/0067304 | A1 | * | 3/2011 | Klockow | ................. C10J 3/485 |
| | | | | | 165/104.19 |
| 2011/0135552 | A1 | | 6/2011 | Dickinson et al. | |
| 2016/0166868 | A1 | | 6/2016 | Dickinson | |
| 2016/0236379 | A1 | | 8/2016 | Rolland et al. | |
| 2018/0221806 | A1 | | 8/2018 | Fang | |

| | | | |
|---|---|---|---|
| 2019/0282948 | A1 | 9/2019 | Mahawili |
| 2020/0291524 | A1 | 9/2020 | Zong |
| 2020/0384403 | A1 | 12/2020 | Mahawili |

FOREIGN PATENT DOCUMENTS

| | | | | |
|---|---|---|---|---|
| CN | 107081044 | A | | 8/2017 |
| CN | 108619866 | A | | 10/2018 |
| DE | 3712007 | A1 | | 10/1988 |
| DE | 102009040997 | A1 | | 4/2011 |
| GB | 2135208 | A | | 8/1984 |
| JP | H09173736 | A | | 7/1997 |
| JP | H09181063 | A | | 7/1997 |
| JP | 2019115871 | A | | 7/2019 |
| KR | 20090056353 | A | | 6/2009 |
| KR | 20100126167 | A | | 12/2010 |
| KR | 101489119 | B1 | * | 2/2015 |
| TW | 201125632 | A | | 8/2011 |
| WO | 2013103198 | A1 | | 7/2013 |
| WO | 2017132186 | A1 | | 8/2017 |
| WO | 2018080885 | A1 | | 5/2018 |

OTHER PUBLICATIONS

International Search Report and Written Opinion from corresponding International Application No. PCT/IB2022/060742 completed Jan. 31, 2023.

PCT International Search Report regarding PCT/US2020/36245, dated Sep. 9, 2020.

PCT Written Opinion of the International Searching Authority regarding PCT/US2020/36245, dated Sep. 9, 2020.

International Search Report of International Application No. PCT/US2017/014815 completed May 8, 2017.

Written Opinion of the International Searching Authority of International Application No. PCT/US2017/014815 mailed May 8, 2017.

Office Action with English translation from corresponding Japanese patent application No. 2024-527840, dated May 29, 2025.

* cited by examiner

LIQUID FILTER APPARATUS WITH THERMAL SHIELD

This is related to U.S. application Ser. No. 16/893,504, which was filed on Jun. 5, 2020 and which is hereby incorporated by reference in its entirety.

TECHNICAL FIELD AND BACKGROUND OF THE INVENTION

In general, the fabrication of semiconductor devices employs the conversion via oxidation, for example, at modest to highly elevated silicon wafer temperatures of certain chemicals to form the desired thin films that make up the circuit layers of semiconductor devices. For example, in a chemical vapor deposition (CVD) process silicon dioxide thin film deposited on a silicon wafer is formed by the oxidation of silane with oxygen at a wafer temperature of approximately 400 degrees centigrade and at processing chamber pressure of around 300 mTorr. Silicon dioxide thin films are also deposited by the oxidation of vapor tetra-ethysiloxane, TOES, with oxygen and ozone at nearly similar processing conditions. Silicon oxide films are also deposited at lower temperatures using low-pressure gas phase plasma enhancement (PECVD). In another process, silane is reacted with ammonia to form silicon nitride at low pressures and moderate wafer temperatures. In these and nearly all other CVD reactions, such as the formation of tungsten and tungsten silicide thin films, nearly 75% of the gaseous feed reactants into the processing chamber pass through the process chamber unconverted.

The exhaust of a typical semiconductor processing chamber is a gaseous stream that is at low pressure and consists of unconverted feed reactants, reaction byproducts, diluent nitrogen carrier gas and particles. These particles are a byproducts of gas phase reactions of the heated reactants in the gas phase, which continue to form and grow in quantity along the fore-line that spans the distance between the processing chamber and the vacuum pump, which could be up to 60 feet in typical fabrication facilities. FIG. 1 is a schematic diagram of a typical CVD or PECVD system that consists of processing chamber connected via a fore-line to a vacuum pump. The vacuum pump is connected via an exhaust line to a typical gas exhaust abatement system that uses natural gas flame to destroy the unreacted process gases followed by a gas/water absorption column to remove acidic gaseous byproducts. The outputs of such abatement systems consist of an acidic waste water stream that normally is neutralized and discharged and a gas stream that is laden with fine particles that are emitted to the atmosphere after passing through large surface area mechanical particle filters.

Particles coat all the connection lines between the processing chamber, the vacuum pumps and the abatement systems and often fill up and plug these lines causing significant maintenance down times at significant added cost of operations. In many cases, the vacuum pumps have to be shut down due to high particle depositions rendering them inoperative. Routinely vacuum pumps are removed and replaced from such lines at extremely high material and labor costs. In few processes, mechanical filters are placed in the vacuum fore-lines trapping these particles to extend the life time of the vacuum pumps. In many cases both the fore-lines and the pump exhaust lines are heated to prevent the condensation of unconverted condensable reactants, which subsequently help to absorb and agglomerate gas-laden particles and create a liquid/solid plugs that are very challenging and costly to clean.

Particles separation from gas-laden particle streams is best achieved using a liquid medium. For example, particles can be separated from large gas flow rates by passing the gas-laden particle stream through a very high flow rate water shower. High particle separation into the water stream can be achieved by proper sizing of the vessel volume and water flow rate. While such separation processes are effective and economical using water they cannot be used in semiconductor processing due to potential adverse water chemical reactions with the reactants in the gas stream and the very high water vapor pressure in low pressure fore-line. In vacuum CVD and PECVD semiconductor processes molecular water present in the fore-line would diffuse backward to the processing chamber itself and degrades the chemical composition of the semiconductor thin films being processed.

In some applications, there is a need to remove particles from a very hot gas stream within the fore-line of a semiconductor processing system. For example, the effluent gas within the fore-line could be hot gases flowing in the fore-line, which have a temperature at about 100 C to 200 C. In some applications there is a need to remove particles immediately post a fore-line plasma abatement system operating at very low vacuum. In both cases the liquid filter may need to be modified to ensure that the very hot gas or plasma exhaust does not impinge directly into the fluid.

SUMMARY

Accordingly, a liquid filter apparatus is provided that uses a liquid as a medium to separate particles from gas-laden particle streams in low pressure fore-line in CVD and PECVD semiconductor processes.

In one form, a liquid filter apparatus for semiconductor process waste separation from a semiconductor process includes a housing having a filter chamber, a process waste inlet, a process waste outlet, and a feed tube in communication with the process waste inlet and which has a feed tube outlet in communication with the filter chamber. The filter chamber forms a liquid reservoir holding a filter liquid therein, and the process waste outlet is in communication with the filter chamber. A deflecting surface is interposed between the filter liquid and the feed tube outlet, which deflects the process waste to prevent direct impingement of the process waste flowing from the feed tube outlet with the filter liquid and further absorbs heat from the process waste.

In one aspect, the deflecting surface is formed by a plate, such as stainless steel to absorb heat from the process waste and thereby form a heat sink. For example, the plate may be imperforate.

In another form, a liquid filter apparatus for semiconductor process waste separation from a semiconductor process includes a housing having a filter chamber, a process waste inlet, a process waste outlet, and a feed tube in communication with the process waste inlet and which has a feed tube outlet in communication with the filter chamber. The filter chamber forms a liquid reservoir holding a filter liquid therein, and the process waste outlet is in communication with the filter chamber. A heat sink is located adjacent the feed tube, which absorbs heat from the process waste to cool the process waste before it impinges the filter liquid. For example, the heat sink may form a deflecting surface to prevent direct impingement of the process waste flowing from the feed tube outlet with the filter liquid.

In any of the above, the feed tube includes an open distal end, which forms the feed tube outlet.

In any of the above, the housing includes an exhaust chamber between the liquid reservoir and the process waste outlet to direct the flow of filtered process waste from the liquid reservoir to the process waste outlet.

In any of the above, the feed tube outlet has an outer diameter, and the deflecting surface has an outer perimeter, with the outer perimeter of the deflecting surface being greater than the outer diameter of the feed tube outlet.

According to a further aspect, the housing includes an internal conduit in fluid communication with the liquid reservoir and the exhaust chamber to direct the flow of filtered process waste from the liquid reservoir to the exhaust chamber.

In any of the above, the liquid filter apparatus further includes a filter liquid control system for controlling the filter liquid flow into and out of the liquid reservoir. For example, the filter liquid control system may include a controller and a fluid circuit, with the controller controlling the fluid circuit to regulate the flow of filter liquid into and out of the liquid reservoir.

In any of the above, the liquid filter apparatus may further include a support to support the deflecting surface above the filter liquid in the liquid reservoir.

In any of the above, the liquid filter apparatus further includes a thermal shield. In one aspect, the thermal shield includes a cup-shaped body, which forms the deflecting surface and/or the heat sink and forms a first volume into which the process waste flows from the feed tube. For example, the cup-shaped body may have a cylindrical wall spaced from the feed tube.

In further aspects, the thermal shield includes a second cup-shaped body. The first cup-shaped body is located in the second cup-shaped body, which forms a second volume into which the process waste flows from the first cup-shaped body and from which the process waste flows to the process waste outlet.

Optionally, the thermal shield may include a third cup-shaped body, which is located in the second cup-shaped body spaced from the first cup-shaped body and which forms a third volume into which the process waste flows and from which the process waste flows to the process waste outlet.

For example, one or more of the cup-shaped bodies may be stainless steel bodies to absorb heat from the waste exhaust before it impinges the filter liquid.

In another aspect, a method of separating solids from process waste in a semiconductor processing system using a liquid filter includes providing a liquid filter with a feed tube, a filter chamber, and exhaust outlet. The method further includes forming a liquid reservoir in the filter chamber and holding a filter liquid in the liquid reservoir, and further providing an indirect pre-filter fluid pathway from the feed tube outlet to the liquid reservoir. The process waste is then directed the into the indirect pre-filter fluid pathway of the filter chamber from the feed tube and thereafter directed into the liquid reservoir of the filter chamber.

In one aspect, the directing the process waste into the indirect pre-filter fluid pathway includes absorbing energy from the process waste prior to the directing the process waste into the liquid reservoir.

In another or further aspect, the process waste is directed into the indirect pre-filter fluid pathway by providing a deflecting surface and spacing the deflecting surface from the feed tube outlet so the deflecting surface directs the process waste into the indirect pre-filter fluid pathway.

In a further aspect, the deflecting surface is sized greater than the diameter of the feed tube outlet.

Optionally, the deflecting surface is supported above the filter liquid in the liquid reservoir.

In addition, the filter liquid in the liquid reservoir is maintained at a liquid level below the deflecting surface.

In another aspect, the filter liquid is circulated through the reservoir to thereby remove the particle filled filter fluid.

DETAILED DESCRIPTION OF THE DRAWINGS

DETAILED DESCRIPTION

Figure 1:
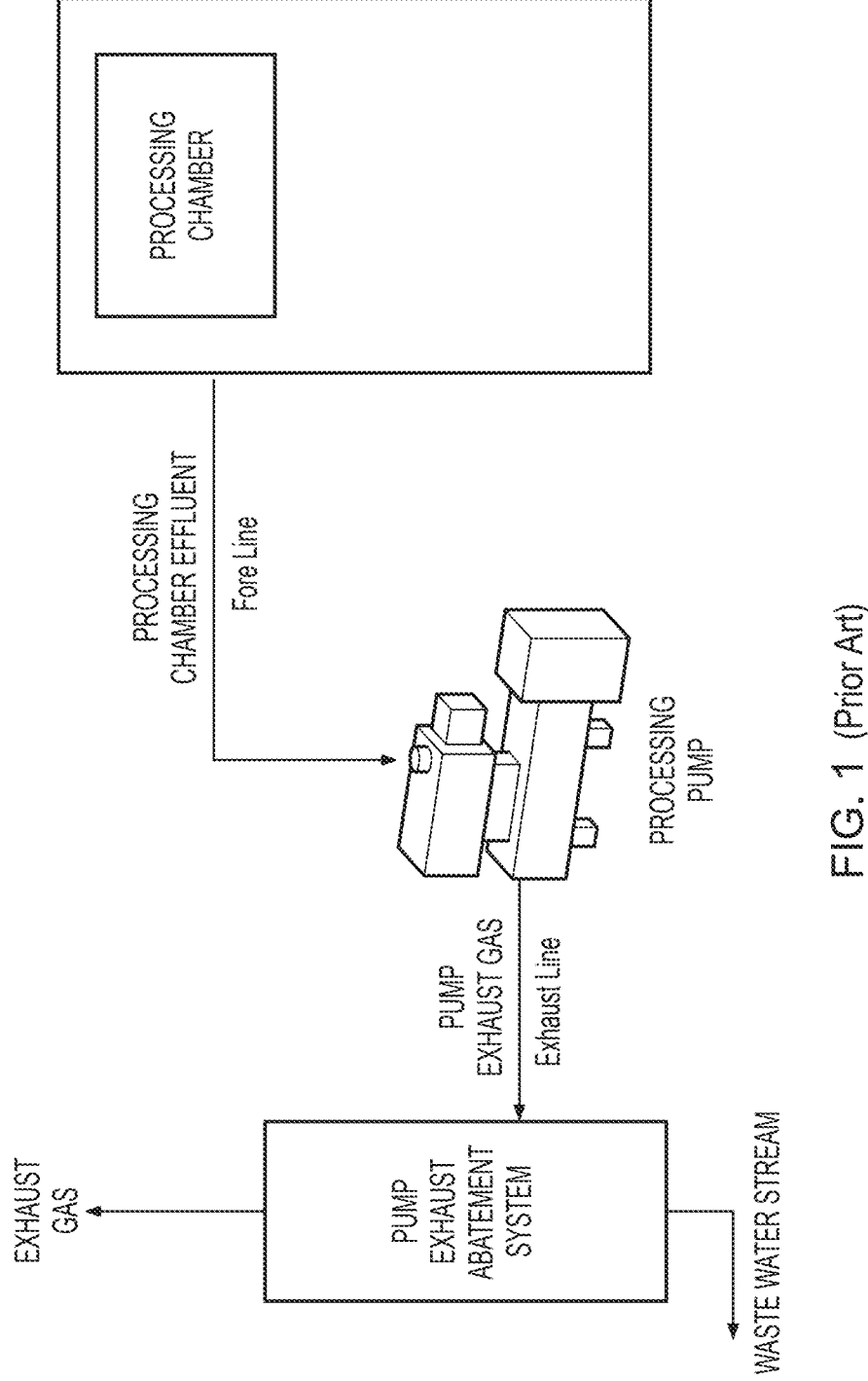
FIG. 1 is a schematic drawing of a prior art CVD or PECVD system that consists of processing chamber connected via a fore-line to a vacuum pump.
Figure 2:
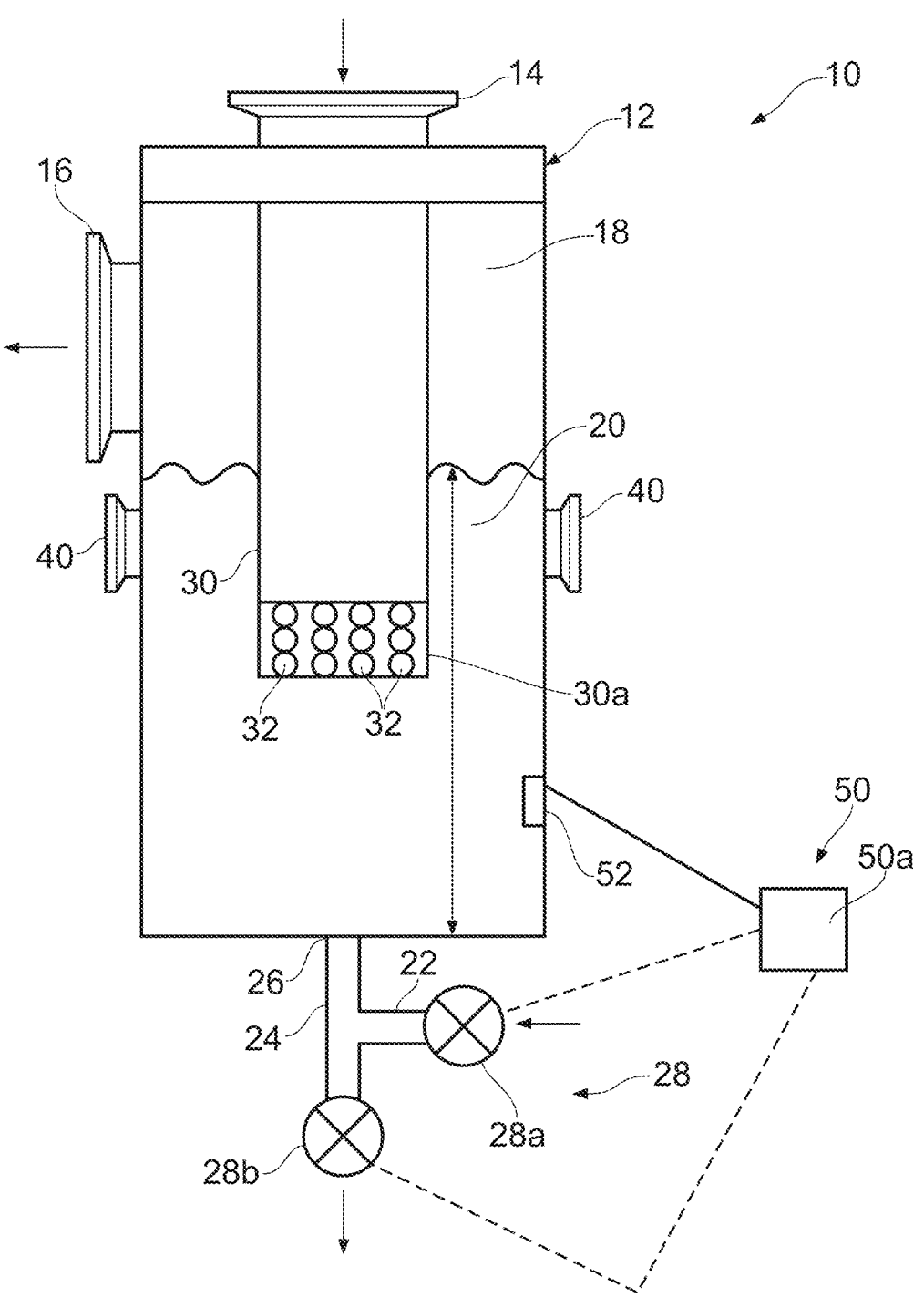
FIG. 2 is a schematic drawing of a liquid filter apparatus for separating solid from a semiconductor process gas.

Referring to FIG. 2, the numeral 10 generally designates a liquid filter apparatus that can be placed in the fore-line with a semiconductor process chamber exhaust and is configured to filter solids or particles from the semiconductor process gas, which is exhausted from the semiconductor process chamber and typically laden with solids or particles as a byproduct of gas phase reactions during the semiconductor process. As will be more fully described below, various modifications can be made to the liquid filter apparatus to address different process parameters, including when processing very high temperature semiconductor process gases and/or plasma, which in some cases will be alternately referred herein to semiconductor process waste or process waste.

Referring again to FIG. 2, filter apparatus 10 includes a housing 12 with a process gas inlet 14 for receiving the semiconductor process gas inflow from a semiconductor processing chamber, which is typically laden with solids and/or particles, and a gas outlet 16, which discharges the filtered process gas after the filtering process. Housing 12 is formed form an inert material, such as aluminum, quartz, polymers, or a stainless steel alloy, and includes a filter chamber 18 that receives the process gas from a semiconductor processing chamber through inlet 14 and from which filtered gas is discharged through outlet 16. Filter chamber 18 forms a liquid reservoir 20 to hold a filter liquid that filters solids and/or particles from the process gas flowing into the filter apparatus.

It has been found that suitable filter liquids to remove or filter out solids or particles from semiconductor process gases but which do not create chemical reactions with the reactants in the process gas stream include liquids with a vapor pressure below approximately $10^{-7}$ Torr and that are chemically inert. Suitable liquids include liquids that can be used in temperatures ranging from −58 degrees centigrade and up to +257 degrees centigrade and that have negligible outgassing. Suitable liquids include liquids that are electrically non-conductive with a dielectric strength of in a range of 15.7 MV/m.

In addition, suitable liquids have kinematic viscosities greater than water (for reference, water has a kinematic viscosity of 1 cSt), for example, kinematic viscosities ranging from 38 to 1830 cSt. For example, suitable liquids include the commercially available Fomblin liquid, or perfluoropolyethers (PFPE). PFPEs have a vapor pressures of approximately $6 \times 10^{-8}$ Torr or below, and are chemically inert. PFPEs can be used in temperatures ranging from −58 degrees centigrade and up to +257 degrees centigrade and have negligible outgassing. PFPEs have a dielectric strength of approximately 15.7 MV/m, are chemically inert, and can be used in temperatures ranging from −58 degrees centigrade and up to +257 degrees centigrade and have negligible outgassing, though as described below, when processing very high temperature processes gases or plasmas, direct impingement and immersion of the process gas into the filter liquid may be minimized or avoided to improve cooling efficiency and separation of the particles from the gas phase. The PFPE filter fluids can be formulated with kinematic viscosities, for example, ranging from 38 to 1830 cSt. However, PFPE are expensive liquids and thus the particle-laden PFPE liquids withdrawn may be sent to commercial purifiers and recycled.

As will be more fully described below, the level of the liquid in the liquid reservoir 20 may be maintained by a control system to assure in some applications immersion of the process gas in the filter liquid, as described more fully below. For example, the height of the liquid in reservoir 20 may fall in a range of 3 inches to 8 inches, or 1 inch to 3 inches, or typically 2 inches to 6 inches depending on the configuration of the filter apparatus. Though as noted, in some when dealing with very high temperature process gases or plasma, the level in the reservoir may be adjusted. The filter size and PFPE volume hold up varies depending on the specific semiconductor process and chemistry.

The filter liquid is delivered to and discharged from liquid reservoir 20 through a filter liquid inlet 22 and a filter liquid outlet 24, which are in communication with the liquid reservoir through conduits, such as tubing, that couple to a common port 26 on housing 12 for delivering and removing filter fluid to and from the liquid reservoir, respectively. Further, as will be more fully described below, in one embodiment, the filter liquid may be circulated through the apparatus 10 to increase the interaction between the filter liquid and the process gas.

Referring again to FIG. 2, apparatus 10 further includes a feed tube 30, which is in communication with the process gas inlet 14 and extends into the filter liquid in the liquid reservoir 20 to directly inject the process gas flowing through the process gas inlet into the filter liquid in the liquid reservoir. Alternately, as described below, the process fee tube may terminate above the filter liquid to indirectly, for example, after cooling, Feed tube 30 is formed from an inert material, such as aluminum, quartz, polymers, and typically a stainless steel alloy. Optionally, the feed tube 30 includes a plurality of perforations 32 at its distal end portion 30a, with its distal end being closed to direct all the flow of the process gas through the perforations 32, which generate a bubbling effect with the process gas in the liter fluid. The size and number and locations of the perforations 32 may vary, but may fall in a range of 0.125 inch in diameter to 0.5 inch or larger, or about 0.25 inch diameter. The purpose of the holes is to efficiently disperse the particle-laden gas stream and intimately mix it with the filter liquid. The gas bubbles created by the gas flowing from the perforations 32 mixes with the filter liquid, and the particles are separated from the gas stream and adsorbed into the filter liquid without imparting any harmful back-streaming to the semiconductor processing chamber. Alternately, as described in reference to FIG. 5, the end of the feed tube may be open to direct the process gas or plasma toward the filter fluid, though with higher temperatures, a thermal shield may be interposed between the open end of the feed tube and the filter fluid, as will be more fully described below.

As noted above, the liquid filter apparatus 10 may include a filter liquid control system 50 for controlling the filter liquid flow into and out of the liquid reservoir 20. For example, the filter liquid control system 50 may include a controller 50a, such as a microprocessor, and a fluid circuit 28, with the controller 50a controlling the fluid circuit via electrically controlled valves 28a, 28b and a pump (not shown, such as a centrifugal or magnetically couple pump), to regulate the flow of filter liquid thorough inlet 22 and outlet 24 and into and out of the liquid reservoir 20. Filter liquid control system 50 may also be configured to maintain the filter liquid at a liquid height in the liquid reservoir, as noted above. In this manner, the filter liquid may be exchanged with new filter liquid when the liquid is "spent" meaning that it has reached a certain level of absorption. For example, when the filter liquid is empirically deemed saturated with particles, it may be desirable to circulate fresh filter liquid in to the reservoir or it may be desirable to circulate the fluid regardless of how much it has absorbed of the particles.

In one embodiment, the control system 50 includes one or more sensors 52. Sensors 52 may be used to detect the level of the filter liquid or measure the opacity or other characteristic of the liquid, which may be used to indicate that the liquid has reached a certain level of particle absorption. For example, determining when the liquid has reached a certain level of particle absorption may be based on another characteristic of the liquid, such as the viscosity. Or both types of sensors may be used—one measuring the filter liquid height and the other measuring the characteristic of the liquid to indicate when the liquid has reached a desired level of particle absorption. In either or both cases, the control system 50 may be used to adjust the flow of filter fluid into and out of liquid reservoir 20 based on the one or more sensors to accommodate the output of the semiconductor chamber and/or to optimize the filtering process.

Optionally, apparatus 10 may include one or more optical windows 40 for viewing the chamber 18. For example, the widows or window 40 may be formed from PYREX or a quartz material and extend into and through the wall of housing 12. Windows may be located beneath the desired filter liquid height so that the liquid can be observed manually for its height and/or opacity or other characteristic to offer manual control over the filter apparatus if desired. Windows 40 may comprise manual or automated optical windows and can be used to assess empirically the entrained solid content within the filter liquid and trigger a manual or automatic withdrawal of certain liquid volume and the addition of fresh filter liquid via valve 28a, 28b for continuous dynamic filter operation without the interruption of the process chamber or production. For example, the valving (e.g. valves 28a, 28b) noted above may provide manual control, including manual override control, over the electrically operated valves so that an operator may manually control apparatus 10.

In the illustrated embodiment, process gas inlet 14 and gas outlet 16 are located at the top and side of housing 12 so that they have a generally ninety degree (right angle) orientation; however, as will be described in reference to the second embodiment, the gas inlet 14 and gas outlet 16 may be rearranged so that they are generally in-line.

In operation, the process gas flow enters at the top of apparatus 10, as shown, and goes through feed tube 30, bubbles through the filter liquid in reservoir 20, where sheds off its particles and leaves the filter liquid reservoir 20. The filtered gas then exits apparatus 10 at the side through gas outlet 16.

Figure 3:
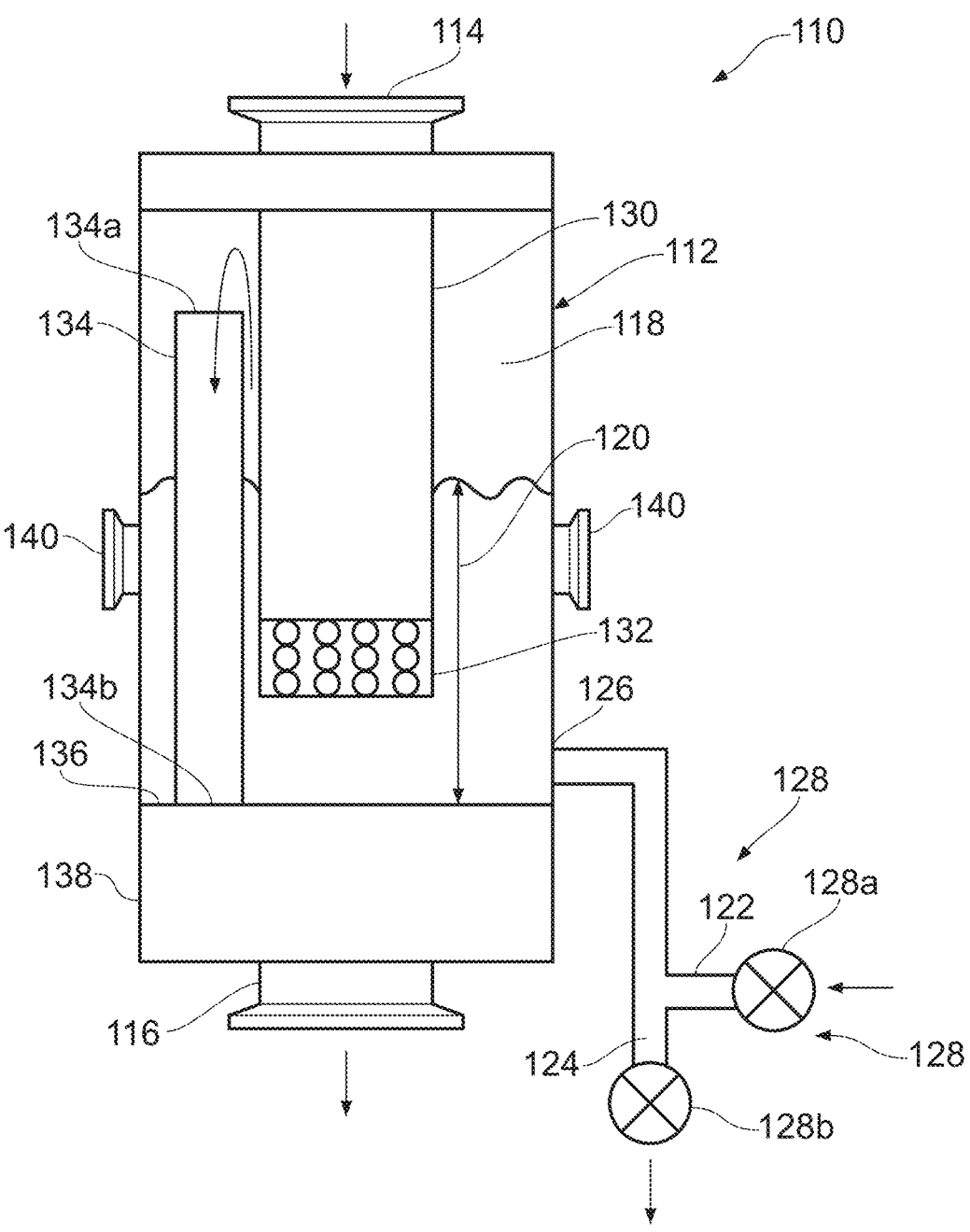
FIG. 3 is a schematic drawing of a liquid filter apparatus with a modified flow path for the gas.

Referring to FIG. 3, the numeral 110 generally designates another or second embodiment of a liquid filter apparatus that can be placed in the fore-line with a semiconductor process chamber exhaust and is configured to filter solids or particles from the semiconductor process gas, which is exhausted from the semiconductor process chamber. Similar to the previous embodiment, filter apparatus 110 includes a housing 112 with a process gas inlet 114 for receiving the semiconductor process gas inflow from a semiconductor processing chamber, which is typically laden with solids or particles, and a gas outlet 116, which discharges the filtered process gas after the filtering process described below. For details of the suitable materials for the housing construction reference is made to the first embodiment.

As best seen in FIG. 3, housing 112 also includes a filter chamber 118 that receives the process gas through process gas inlet 114 and from which the filtered gas is discharged through gas outlet 116. Filter chamber 118 forms a liquid reservoir 120 to hold a filter liquid that filters solids or particles from the process gas flowing into the filter apparatus. For examples of suitable liquid characteristics and suitable liquids that can filter solids or particles from semiconductor process gases, reference is made to the first embodiment.

In the illustrated embodiment, process gas inlet 114 and gas outlet 116 are generally in-line. To that end, housing 120 includes an exhaust chamber 138 between liquid reservoir 120 and gas outlet 116 to allow the filter gas to be exhausted from the filter chamber internally prior to being discharged through gas outlet 116. In-line filter apparatuses may be used in certain locations where the right-angle filter apparatus of the first embodiment may not fit the existing fore-line geometry.

To form exhaust chamber 138, housing 112 includes a solid plate 136 that divides in the internal space in housing 112 between filter chamber 118 and exhaust chamber 130 and further includes an internal conduit 134, which includes a first open end 134a located above the height of the filter liquid and a second open end 134b, which is extended through plate 136 for discharge into exhaust chamber 130. Although illustrated as terminating at plate 136, it should be understood that internal conduit 134 may extend through the plate into the exhaust chamber 138. A suitable conduit includes a tube or tubing that is formed from an inert material, such as aluminum, quartz, polymers and typically a stainless steel alloy.

Similar to the previous embodiment, housing 110 includes a feed tube 130 that is in fluid communication with inlet 114 and extends into liquid reservoir 120 to inject the process gas into the filter fluid in a similar manner as described above. Further details of the feed tube 130 reference is made to feed tube 30.

Also similar to previous embodiment, the level of the liquid in the liquid reservoir 120 may be maintained by a control system to assure immersion of the process gas in the filter liquid, as described above.

Apparatus 110 operates in a similar manner to apparatus 10. Process gases flows into inlet 114 and is injected into the filter liquid in reservoir 120 via feed tube 130. Due to the presence of the perforations 132 in the feed tube 130, the process gas is bubbled into the filter liquid, where the solids or particles are removed from the process gas as they are absorbed by the filter liquid. The filtered gas is then exhausted from the filter chamber 118 through internal conduit 134, which directs the filtered gas into exhaust chamber 138, which then discharges the filtered gas through gas outlet 116.

In a similar manner to the previous embodiment, the filter liquid may be circulated through the apparatus 110 via fluid circuit 128, which includes an inlet valve 128a (which is in fluid communication with liquid inlet 122) and an outlet valve 128, which in fluid communication with liquid inlet 124), and various conduits and a pump (not shown, such as a centrifugal or magnetically couple pump), to direct the flow of filter liquid to and from the liquid reservoir 120 through a common port 126, as noted above, to circulate the filter liquid or simply replace the filter liquid.

Apparatus 110 may also include optical windows 140 for viewing the chamber 118. For example, the widows or window 40 extend into and through the wall of housing 12 and may be located beneath the desired filter liquid height so that the liquid can be observed manually for its height and/or opacity or other characteristic to offer manual control over the filter apparatus if desired.

As stated above, in operation, the particle-laden process gas flow enters at the top of apparatus 110, as shown, and goes through the internal feed tube 130, bubbles through the filter in reservoir 120, and enters the internal conduit 134 after it is filtered and sheds off its particles and leaves the filter liquid reservoir 120. The filtered gas then enters exhaust chamber 138 and exits apparatus 110 at the bottom and in in-line with the top process gas input.

Figure 4:
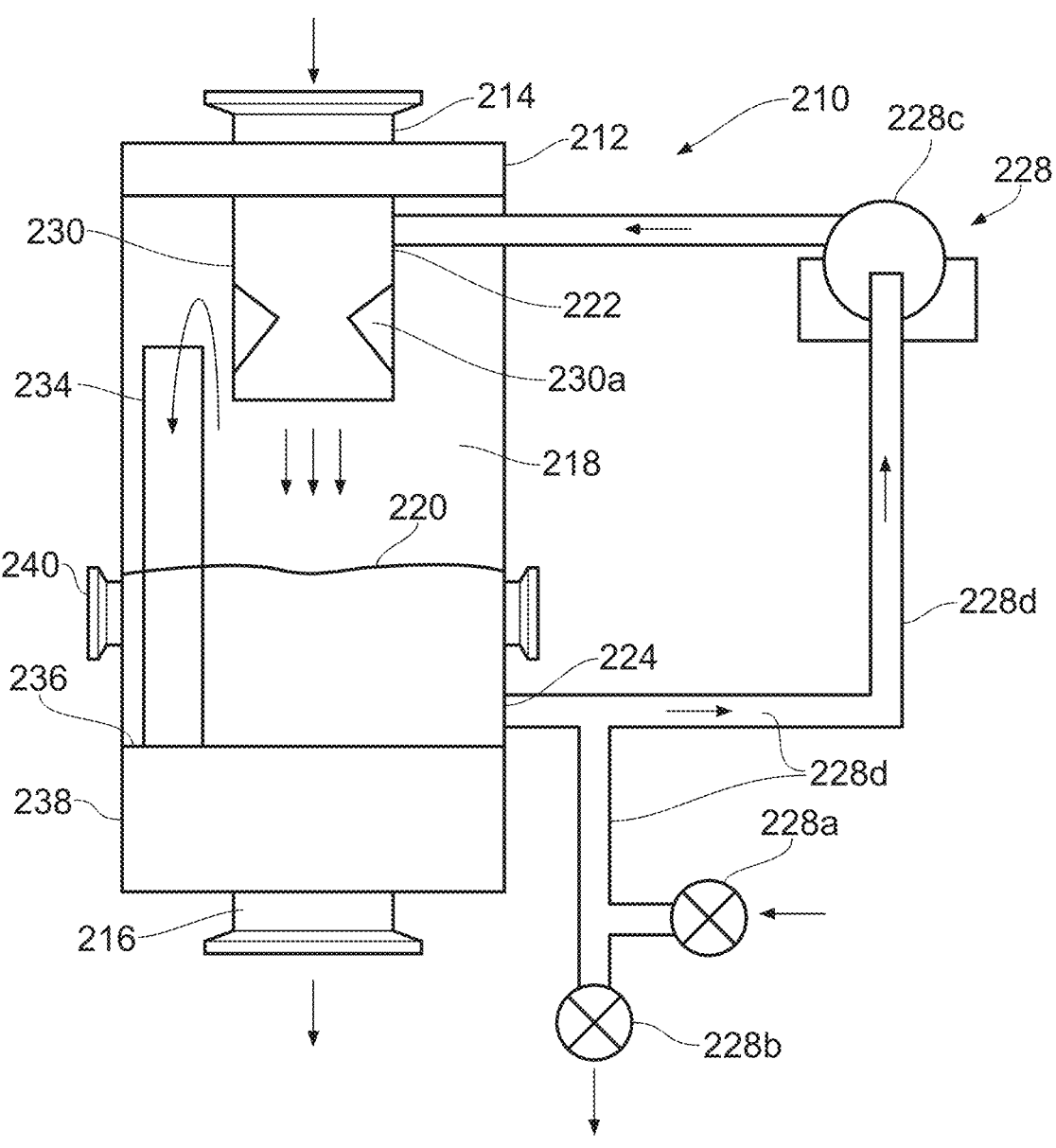
FIG. 4 is a schematic drawing of a liquid filter apparatus with a venturi.

Referring to FIG. 4, the numeral 210 generally designates another or third embodiment of a liquid filter apparatus that can be placed in the fore-line with a semiconductor process chamber exhaust and is configured to filter solids or particles from the semiconductor process gas, which is exhausted from the semiconductor process chamber. Similar to the previous embodiment, filter apparatus 210 includes a housing 212 with a process gas inlet 214 for receiving the semiconductor process gas inflow from a semiconductor processing chamber, which is typically laden with solids or particles, and a gas outlet 216, which discharges the filtered process gas after the filtering process described above. For details of the suitable materials for the housing construction reference is made to the first embodiment.

As best seen in FIG. 4, housing 212 also includes a filter chamber 218 that receives the process gas through process gas inlet 214 and from which the filtered gas is discharged through gas outlet 216. Filter chamber 218 forms a liquid reservoir 220 to hold a filter liquid that filters solids or particles from the process gas flowing into the filter apparatus. For examples of suitable liquid characteristics and suitable liquids that can filter solids or particles from semiconductor process gases, reference is made to the first embodiment.

In the illustrated embodiment, process gas inlet 214 and gas outlet 216 are generally in line similar to the second embodiment. To that end, housing 220 also includes an exhaust chamber 238 between liquid reservoir 220 and gas outlet 216 to allow the filter gas to be exhausted from the filter chamber internally prior to being discharged through gas outlet 216. For further details of exhaust chamber 238 reference is made to the previous embodiment.

Similar to the previous embodiment, housing 210 includes a feed tube 230 that is in fluid communication with inlet 214 but extends into chamber 218 and optionally terminates above the filter fluid. Feed tube 230 is also formed from an inert material, such as aluminum, quartz, polymers and typically a stainless steel alloy In the illustrated embodiment, feed tube 230 includes a restriction 230a to form a venturi tube and an inlet 222 for the filter fluid to flow into the feed tube 230 and to generate the pressure differential to draw in the process gas into feed tube 230 through inlet 214 where it mixes with the filter liquid and thereafter is discharged into the filter chamber 218 via feed tube 230. The filter liquid is also discharged into the liquid reservoir 220 from feed tube 230.

In a similar manner as described above, the filter fluid may be circulated through apparatus 210 by way of a fluid circuit 228 (e.g. controlled by a controller, such as described above, which includes, in addition to valves 228a and 228b, a pump 228c (such as a centrifugal or magnetically coupled pump), which circulates the filter fluid though apparatus 210 by way of various conduits 228d.

In the illustrated embodiment, as noted, the liquid inlet 222 is formed in the feed tube 230, while the liquid outlet 224 is located in the liquid reservoir beneath the liquid level.

Apparatus 210 operates in a similar manner to apparatus 110. Process gases flows into inlet 214 but whose flow is enhanced by the venturi effect of the filter liquid flowing through feed tube 230. The process gas mixes with the filter liquid and is then filtered and injected into the filter chamber 118 via feed tube 230. The filtered gas is then exhausted from the filter chamber 218 through internal conduit 234, which directs the filtered gas into exhaust chamber 238, which then discharges the filtered gas through gas outlet 216.

In a similar manner to the previous embodiment, the filter liquid may be circulated through the apparatus 210 via a fluid circuit 228, which as noted includes an inlet valve 228a (which is in fluid communication with liquid inlet 222), an outlet valve 228b (which in fluid communication with liquid inlet 224), and various conduits to direct the flow of filter liquid trough apparatus 210. Fluid circuit 228 may also be configured to replace the filter liquid after a given time period or after the filter liquid has reached a desired level of particle saturation, as described above.

Apparatus 210 may also include optical windows 240 for viewing the chamber 218, similar to the second embodiment.

Figure 5:
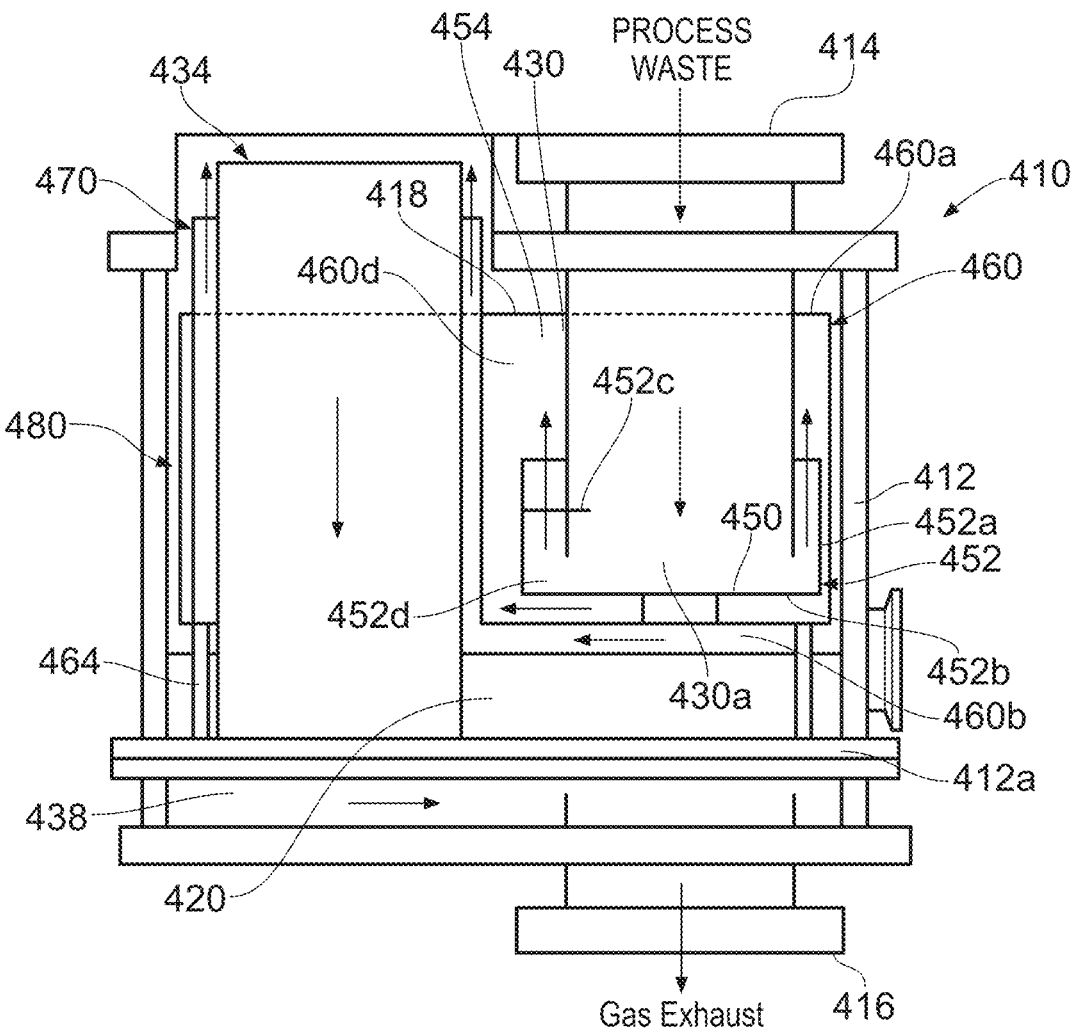
FIG. 5 is a schematic drawing of a liquid filter apparatus with a thermal shield.

Referring to FIG. 5, the numeral 410 generally also designates a liquid filter apparatus for filtering solids and/or particles from semiconductor waste in semiconductor. Similar to the previous embodiments, filter apparatus 410 includes a housing 412 with a process waste inlet 414 for receiving the semiconductor process waste, such as semiconductor process waste gas and/or plasma, inflow from a semiconductor processing chamber, which is typically laden with solids or particles, and a filtered waste outlet 416, which discharges the filtered process waste after the filtering process described below. For details of the suitable materials for the housing construction reference is made to the first embodiment.

As best seen in FIG. 5, housing 412 similarly includes a filter chamber 418 that receives the process waste through waste inlet 414 and from which the filtered waste is discharged through filtered waste outlet 416. Filter chamber 418 forms a liquid reservoir 420 to hold a filter liquid that filters solids or particles from the process waste flowing into the filter apparatus. For examples of suitable liquid characteristics and suitable liquids that can filter solids or particles from semiconductor process gases, reference is made to the first embodiment.

In the illustrated embodiment, process waste inlet 414 and waste outlet 416 are generally in line similar to the second embodiment. Similar to the previous embodiment, housing 410 includes a feed tube 430 that is in fluid communication with inlet 414 but extends into chamber 418 and optionally terminates above the filter fluid. Feed tube 430 is also formed from an inert material, such as aluminum, quartz, polymers, or a stainless steel.

However, housing 420 is configured to provide an indirect pre-filter fluid pathway for the process waste from the feed tube outlet 430a to the liquid reservoir 420 to reduce the energy, for example, when filtering very hot process waste, such as gases and/or plasma, with a temperature in a range of 200-600 degrees C. or higher. Further, as will more fully described below, the housing 420 is configured to cool the process waste before it impinges the filter liquid.

To direct the waste into the indirect pre-filter fluid pathway, liquid filter apparatus 410 includes a deflecting surface 450 that is located adjacent the feed tube outlet 430a. In this manner, the waste does not directly impinge the filter fluid and, instead, is directed to the indirect pre-filter fluid pathway. In addition, as will be more fully described below, the deflecting surface is formed from a material that absorbs heat to thereby form a heat sink. By impinging on this deflecting surface, much of the initial thermal energy is therefore absorbed, thus creating a thermal shield that can absorb the ionic and high electron energy when, for example, a plasma exhaust is injected into the filter apparatus, helping to rapidly quench the exited electrons and ions and cooling the hot gases.

Depending on its construction, the thermal shield can also significantly increase the heat exchange surface area and the gas-liquid interfacial area leading to efficient cooling and particles separation from the gas phase. This novel fluid filter has been tested to show that when the input gas or plasma has a temperature in the range of 400 C to 600 C or higher, the fluid temperature is maintained at a low temperature in the range of 45 C to 70 C well below any potential chemical reaction and fluid properties degradation while significantly increasing particle separation from the gas phase.

The first deflecting surface may be formed by a plate. Optionally, the plate is provided by a cup-shaped body 452, with a side wall 452a, such as a cylindrical side wall, that extends upwardly from a base wall 452b, which may form the plate, such as an imperforate plate. Body 452 may be a unitary body and be formed by molding or welding. Optionally, the cup-shaped body may be supported so that it straddles and surrounds the end of feed tube 430, but is spaced therefrom so that base wall 452*b*, which as noted may form the initial deflecting surface, is spaced from the feed tube outlet 430*a* of feed tube 430. In this manner, the outer perimeter of the deflecting surface may be greater than the outer diameter of the feed tube outlet.

The indirect pre-filter fluid pathway may be formed by additional directing or deflecting surfaces. For example, the additional deflecting surfaces may be formed by discrete structures, including discrete structures assembled or joined together, for example, during their forming process or post forming process, such as by welding. For example, a second deflecting surface 452*c* may be formed by the inside surface of the side wall 452*a* of the cup-shaped body 452, which together with the first deflecting surface 450 may form a first volume of space 452*d* into which the waste flows once it has exited the feed tube outlet 430*a*.

A third deflecting surface 454 may be provide by a second cup-shaped body 460, which supports first cup-shaped body 452 therein and which is supported on the lower wall 412*a* of housing 412 by one or more supports 464. Optionally, second cup-shaped body 460 is supported on the lower wall 412*a* of housing 412 above the filter liquid level, which may be controlled by a control system in a similar manner as described above.

Second cup-shaped body 460 also includes a side wall 460*a*, such as a cylindrical side wall, that extends upwardly from a base wall 460*b* and which is taller than the side wall 452*a* of cup-shaped body 452 so that when waste flows from the first volume 452*d* it will flow into a second volume 460*d* formed by second cup-shaped body 460 above and between cup shaped body 452. Inner surface 460*c* of side wall 460*a* will, therefore, form the third deflecting surface to direct the flow of waste along the indirect pre-filter fluid pathway through housing 412.

In this manner, as the waste flows into the second volume it flows up and over the top of side wall 460*a* and down to the filter liquid in the liquid reservoir 420 beneath second cup-shaped body 460. Some waste may flow between the two side walls 452*a* and 460*a* emerge from under the first cup-shaped body (as shown by the green arrow in FIG. 5) and thereafter flow upwardly and then down to the filter liquid in the liquid reservoir 420.

In each case the deflecting surfaces may be formed from material that absorbs heat, such as stainless steel, to thereby form heat sinks.

Apparatus 410 operates in a similar manner to apparatuses 210 and 110. Process waste (gases and/or plasma) flows into inlet 414 and then after cooling mixes with the filter liquid. The filtered waste is then exhausted from the filter chamber 418 through an internal conduit 434, which extends through base wall 460*b* of second-cup-shaped body 460. Internal conduit 434 then directs the filtered waste into exhaust chamber 438, which then discharges the filtered waste through waste outlet 416.

The flow of filtered waste may be directed to internal conduit 434 through another cylindrical side wall 470, which is also supported in second cup-shaped body 460 and is coaxial with and spaced from internal conduit 434. Additionally, cylindrical side wall 470 is spaced from first cup-shaped body 452 and further extends above both cup-shaped bodies 452 and 460. Hence the outer surface 470*a* of cylindrical wall 470 also forms a deflecting surface (and hence forms part of the indirect pre-filter fluid pathway) to direct the flow of waste upwardly over the top edge of second cup-shaped body 460, as best understood from FIG. 5. Additionally, the inside surface 470*b* of cylindrical wall 470 forms a post filter pathway that allows the filtered waste to flow upwardly and into internal conduit 434.

In a similar manner to the previous embodiment, the filter liquid may be circulated through the apparatus 410 via a fluid circuit. The fluid circuit may also be configured to replace the filter liquid after a given time period or after the filter liquid has reached a desired level of particle saturation, as described above. Further, the control system optionally maintains the level of the filter liquid below the second cup-shaped body to thereby form part of the post filter pathway for the filtered waste to flow.

Housing 412 also includes an exhaust chamber 438 between liquid reservoir 420 and waste outlet 416 to allow the filter waste to be exhausted from the filter chamber internally prior to being discharged through outlet 416. For further details of exhaust chamber 438 reference is made to the previous embodiment.

Suitable materials for the deflecting surfaces may be stainless steel, which is inert and additionally can absorb heat and, hence, cool the waste, as noted above.

The cup-shaped bodies 452 and 460 and cylindrical wall 470 may be a unitary assembly 480 that is joined together by welding or molding or may be discrete components that are assembled to form the indirect pre-filter pathway and post filter pathway for the waste flowing through the apparatus 410.

Accordingly, using a liquid filter the apparatus may be used to separate solids from process waste in a semiconductor processing system. By providing an indirect pre-filter fluid pathway from the feed tube outlet to the filter liquid reservoir, the waste can be cooled prior to imping the filter fluid, which can absorb much of the initial thermal energy. The resulting thermal shield can absorb the ionic and high electron energy when a plasma exhaust is injected into the apparatus to help rapidly quench the exited electrons and ions and cooling the hot gases. The components forming the thermal shield can also significantly increase the heat exchange surface area and the gas-liquid interfacial area leading to efficient cooling and particles separation from the gas phase.

Figure 6:
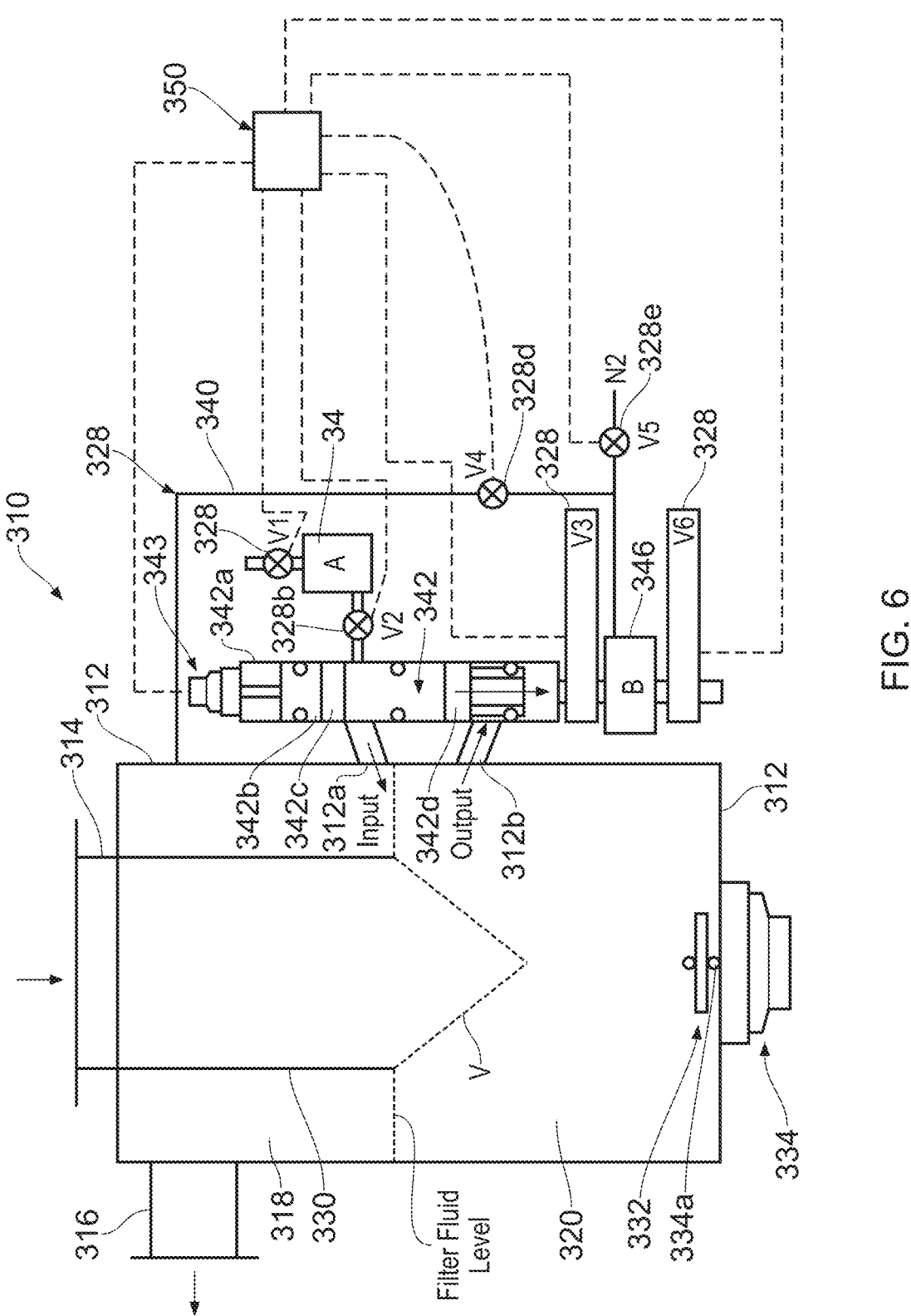
FIG. 6 is a schematic drawing of a liquid filter apparatus that stirs the filter liquid.

Referring to FIG. 6, the numeral 310 generally designates a liquid filter apparatus that stirs the filter fluid that can be placed in the fore-line between a semiconductor processing chamber and a processing pump (see FIGS. 6 and 7) and is configured to filter solids or particles from the semiconductor process gas, which is exhausted from the semiconductor process chamber. Further, as will be more fully described below, liquid filter apparatus 310 is configured to be in communication with a fluid circuit (328, described below) in an arrangement that allows for automatic fluid addition and removal of filter fluid to or from chamber (318) of the fluid apparatus.

Similar to the previous embodiment, filter apparatus 310 includes a housing 312, which forms a filter chamber 318, with a process gas inlet 314 for receiving the semiconductor process gas inflow from a semiconductor processing chamber into chamber 318 (see FIG. 6 for example, where filter apparatus 310 is mounted in the fore-line of the processing system, between the semiconductor chamber and the process pump), which is typically laden with solids or particles, and a gas outlet 316, which discharges the filtered process gas from chamber 318 after the filtering process described below. For details of the suitable materials for the housing construction reference is made to the first embodiment.

As best seen in FIG. 6, chamber 318 forms a liquid reservoir 320 to hold a filter liquid that filters solids or particles from the process gas flowing into the filter apparatus, and which is then discharged as waste. For examples of suitable liquid characteristics and suitable liquids that can filter solids or particles from semiconductor process gases, reference is made to the first embodiment. In the illustrated embodiment, process gas inlet 314 and gas outlet 316 are generally in line similar to the second embodiment with a right angle arrangement. Also similar to the previous embodiment, housing 310 includes a feed tube 330 that is in fluid communication with inlet 314 and that extends into chamber 318 and optionally terminates at or slightly below the filter fluid in liquid reservoir 320. Feed tube 330 is also formed from an inert material, such as aluminum, quartz, polymers and typically a stainless steel alloy.

In the illustrated embodiment, chamber 318 includes a rotating member 332, which is driven to rotate by a motor 334. Motor 334 is mounted external or outside of housing 312 but whose drive shaft 334a may extend through a sealed opening provided in housing wall 312a to engage rotating member 332 or may not penetrate the housing an instead couple to the rotating member via a magnetic coupling, as noted below. For example, the sealed opening may be formed by a sealed bushing or sealed grommet. The rotating member 332 may be in the form of multiple blades commonly mounted on an annular support, which is rotatably mounted at the bottom portion of housing wall 312a.

In one embodiment, drive shaft 334a of motor couples to rotating member 332 by a magnetic coupling through the wall of the housing 312. For example, shaft 334a may include a magnet, and rotating member 332 may also include a magnet, for example, mounted in or about the annular support to provide the magnetic coupling.

As noted above, rotating member 332 is located at the bottom portion of housing 312 in liquid reservoir 320 and, when rotated by motor 334, stirs or rotates the filter fluid in liquid reservoir 320, optionally in a continuous fashion. This fluid rotation enables the particles of varying densities to thoroughly mix with the filter fluid and thereafter is discharged from the filter chamber 318 via an outlet 312b formed in housing wall 312a. In addition, the rate of rotation will impact the discharge rate of the fluid from chamber via outlet 312b and the rate of inflow of the filter fluid into chamber 318 via an inlet 312c (also formed in housing wall 312a) from the fluid circuit described below. Further, the rate of rotation will determine the depth of the vortex V generated due to fluid rotation.

In a similar manner as described above, the filter fluid may be selectively and automatically circulated through apparatus 310 by way of a fluid circuit 328 (e.g. controlled by a controller, such as programmable logic controller, including microprocessor, such as described below).

In the illustrated embodiment, fluid circuit 328 includes a conduit 340, which is in fluid communication with the chamber 318 above the filter fluid, a sliding valve 342, and a plurality of control valves 328a (V1), 328b (V2), 328c (V3), 328d (V4), 328e (V5), and 328f (V6), which are opened and closed by a controller 350 (such as a microprocessor), to automatically control the flow of fluid through conduit 340 and through valve 342 based on a sequence of valve openings and closings described below. By providing fluid communication between chamber 318 (above the filter fluid) and conduit 340, conduit 340 is subject to the pressure in chamber 318, which is under a vacuum (or low or very low pressure) due to the fluid communication between the fore-line and chamber 318 through outlet 316. This vacuum (or low or very low pressure) is then extended to other parts of circuit 328, as described below. For example, conduit 340 may comprise a stainless steel tube.

As best seen in FIG. 6, sliding valve 342 includes a cylinder 342a and a sliding piston 342b, which is moved up and down cylinder 342a (as viewed in FIG. 6) by a motor 343, which is also controlled by controller 350 to open and close communication with the chamber 318 and circuit 328 through valve 342.

Additionally, circuit 328 includes two chambers 344 and 346, with chamber 344 in selective fluid communication with a make-up fluid supply via valve 328a (V1), and with chamber 346 in selective fluid communication with a supply of nitrogen gas via valve 328c (V3) and via valve with conduit 340. Thus, when valve 328a (V1) is opened, chamber 344 is filled with make-up fluid. Similarly, when valve 328e (V5) is opened, chamber 346 is filled with nitrogen. When valve 328e (V5) is closed, and valve 328d (V4) is open, the pressure in chamber 346 is then reduced to a low, very low or vacuum pressure.

To control the flow of fluid into and out of reservoir 320, cylinder 342a includes a first port (optionally formed by a conduit) in fluid communication with inlet 312c of housing 312 and a second port (optionally formed by a conduit) in fluid communication with outlet 312b of housing 312. Further, piston 342b includes two transverse passageways 342c and 342d, which when moved by motor 343 can align with the ports of the cylinder 342a to allow fluid communication between reservoir 320 and chamber 344 and/or chamber 346, depending on the open or closed state of valve 328b (V2) and valve 328c (V3). Valve 328b (V2) provides for selective fluid communication between chamber 344 and sliding valve 342 and reservoir 320 depending on the position of the piston 342b, and valve 328c (V3) provides for selective fluid communication between chamber 346 and sliding valve 342 and reservoir 320 depending on the position of the piston 342b.

Figure 6A:
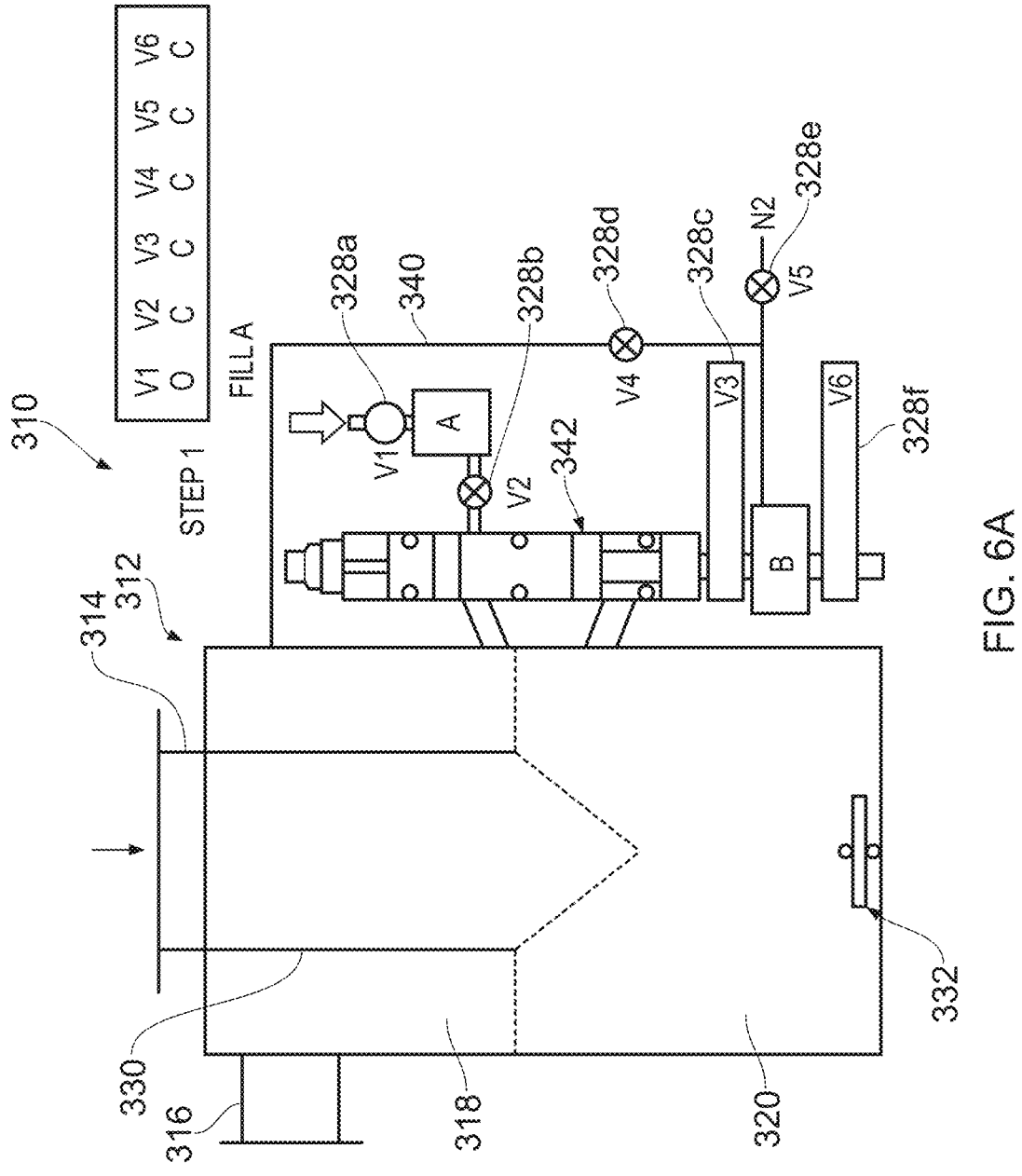
FIG. 6A is a similar view to FIG. 6 showing the sequence of valve openings.
Figure 6B:
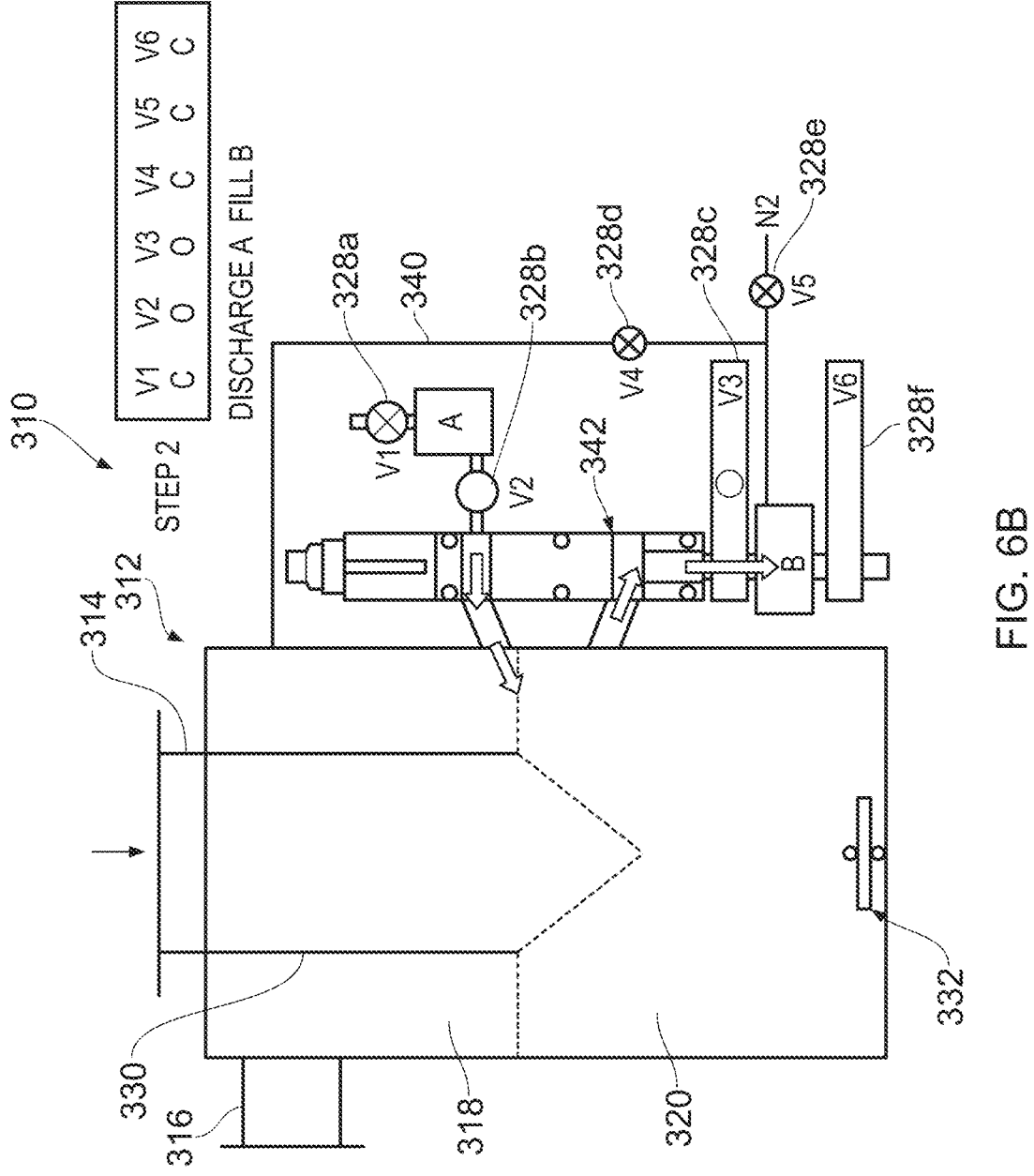
FIG. 6B is a similar view to FIG. 6 showing the sequence of valve openings.
Figure 6C:
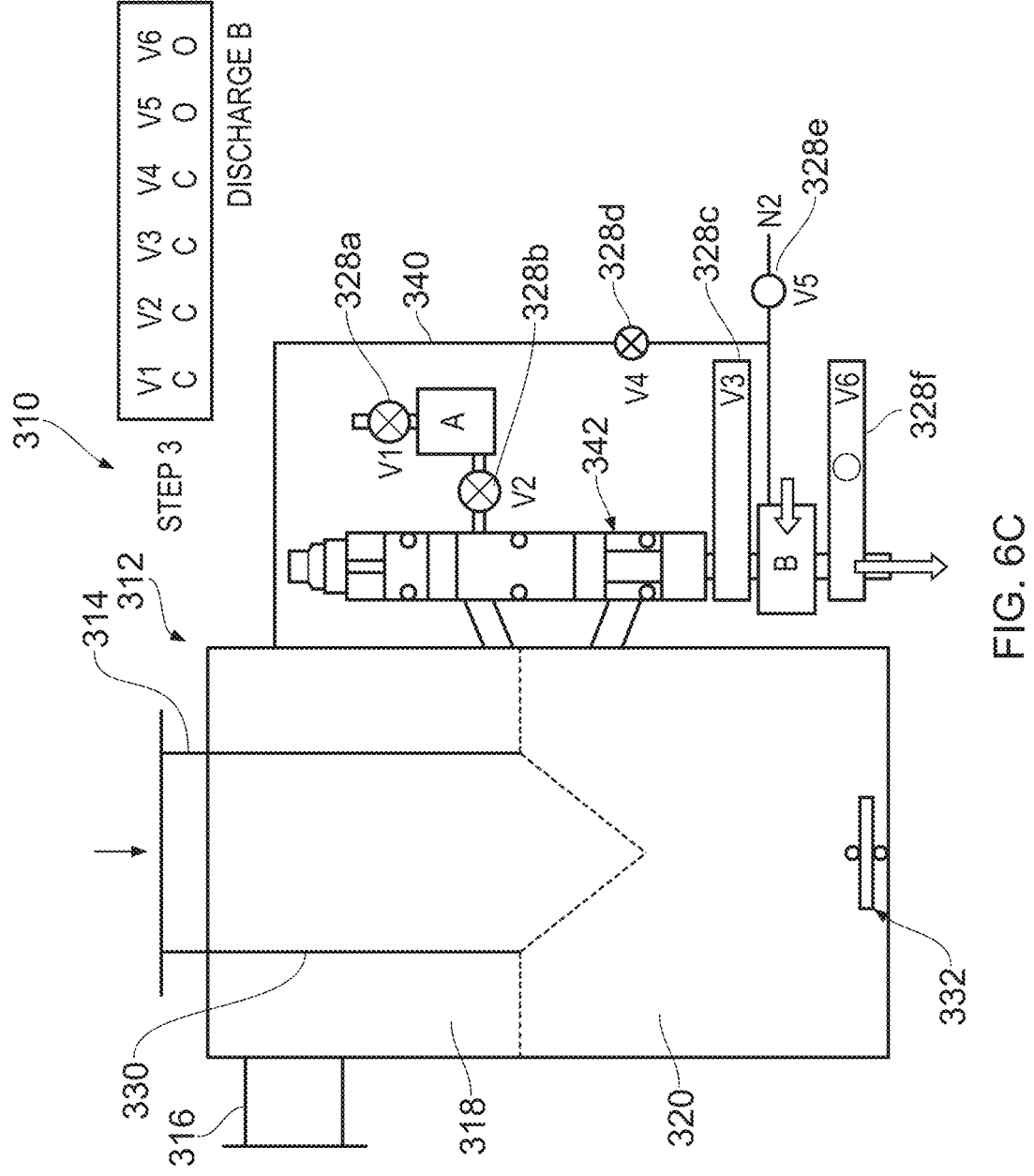
FIG. 6C is a similar view to FIG. 6 showing the sequence of valve openings.
Figure 6D:
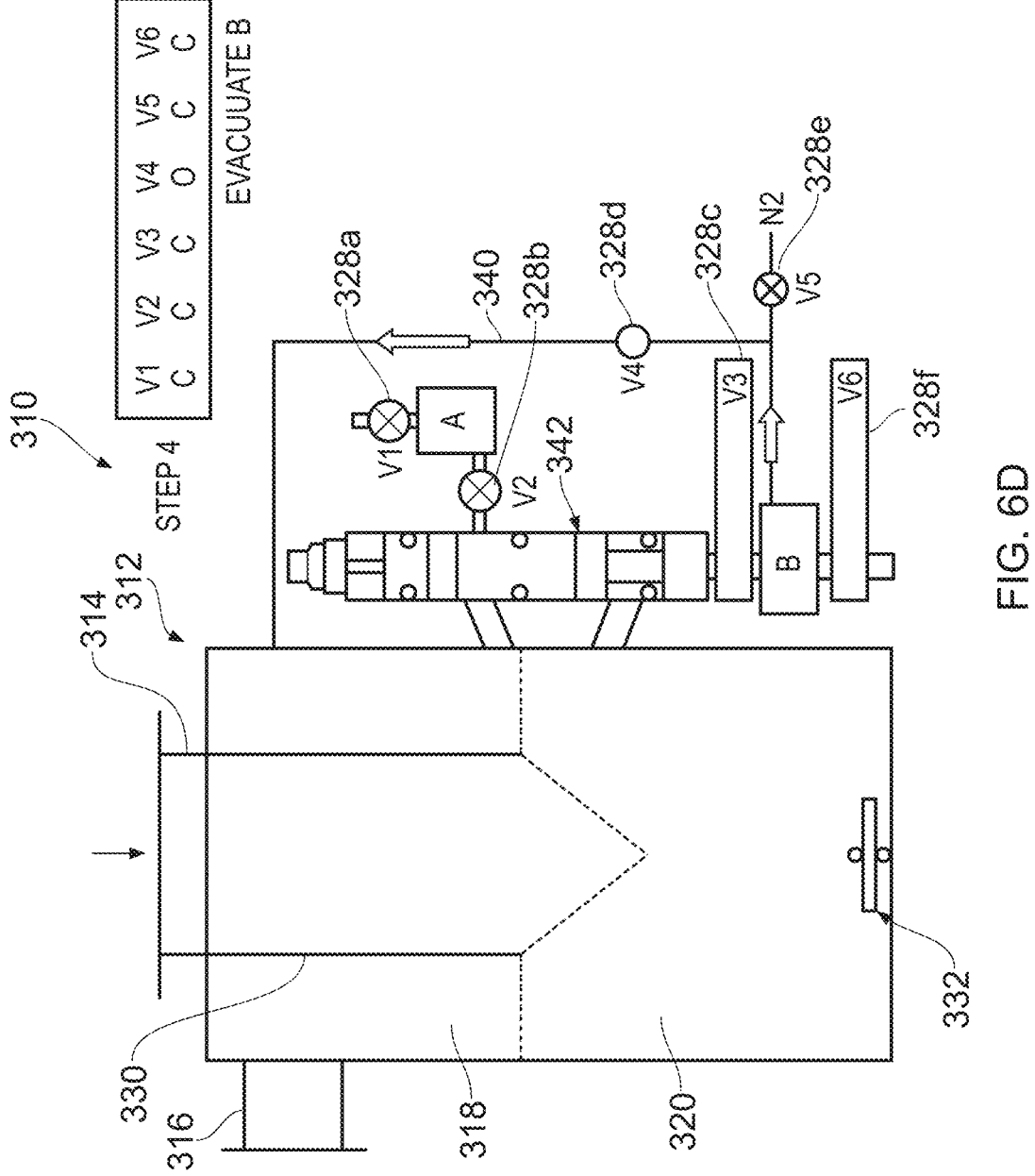
FIG. 6D is a similar view to FIG. 6 showing the sequence of valve openings.

As best understood from FIG. 6, when valve 328a (V1) is open and all the other valves (328b (V2), 328c (V3), 328d (V4), 328e (V5), and 328f (V6)) are closed (step 1, see FIG. 6A), make-up fluid is directed to chamber 344. When valve 328b (V2) and valve 328c (V3) are open and the rest of the valves (328a (V1), 328d (V4), 328e (V5), and 328f (V6)) are closed (step 2, see FIG. 6B) and motor 343 is driven to move the piston is in the lower position (as viewed in FIG. 6, where the transverse passageways 342c and 342d of piston 342b are aligned with the ports of the cylinder 342a), make-up fluid is sent to reservoir 320 and particle-filled fluid is discharged to chamber 346. When valves 328a (V1), 328b (V2), 328c (V3), and 328d (V4) are closed and valves 328f (V6) and 328e (V5) are opened (step 3, see FIG. 6C) then fluid is removed from chamber 346, driven by a pre-set nitrogen flow passing through the open valve 328e (V5). Once a given time is allowed so the fluid is removed from chamber 346, then valves 328a (V1), 328b (V2), 328c (V3), and 328e (V5), and 328f (V6) are closed and valve is 328d (V4) is opened to allow chamber 346 to evacuate so that the pressure in chamber 346 equilibrates with the fore-line pressure (step 4, see FIG. 6D). And the sequence is repeated by the controller. The timing of the sequence steps can vary because it is based the particular process and settings for the process. On average it is anticipated that the sequence timing could be cycling every 10 to 20 seconds depending on the particle loading of the fluid. If the semiconductor process effluent is of low particle loading the sequence could be up to 30 to 60 minutes.

Apparatus 310 operates in a similar manner to apparatus 110 in that process gases flows into inlet 314 but whose flow is then enhanced by the vortex effect of the filter liquid flowing around feed tube 330. The process gas mixes with the filter liquid and is then filtered after it is injected into the filter chamber 318 via feed tube 330. The filtered gas is then exhausted from the filter chamber 318 through gas outlet 316.

In the illustrated embodiment, the filter liquid is thus dynamically circulated through the apparatus 310 via fluid circuit 328.

Fluid circuit 328 may also be configured to replace the filter liquid after a given time period or after the filter liquid has reached a desired level of particle saturation, as described above.

Figure 7:
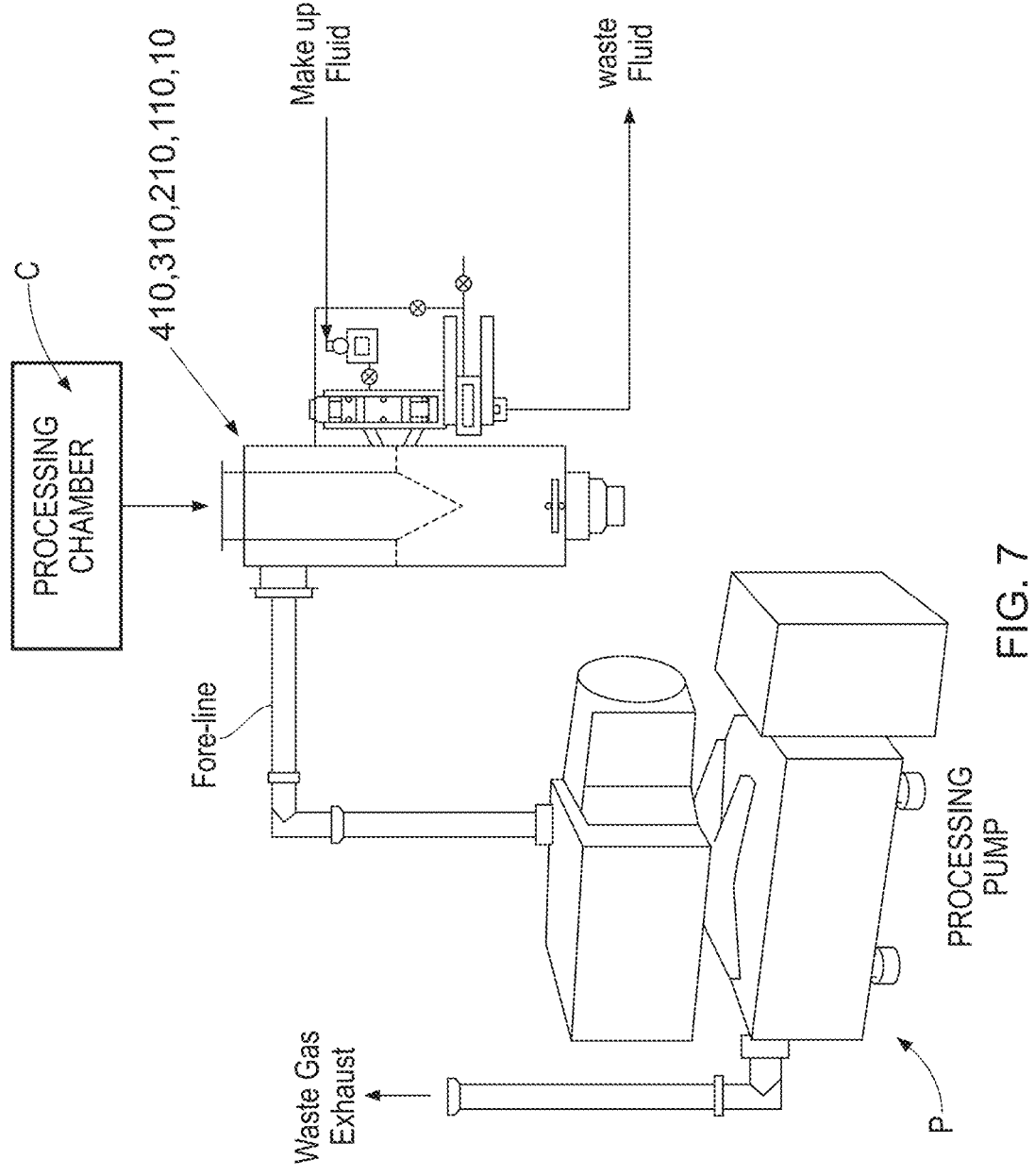
FIG. 7 is a schematic drawing of a liquid filter apparatus illustrating the liquid filter apparatus installed in a semiconductor processing system.
Figure 8:
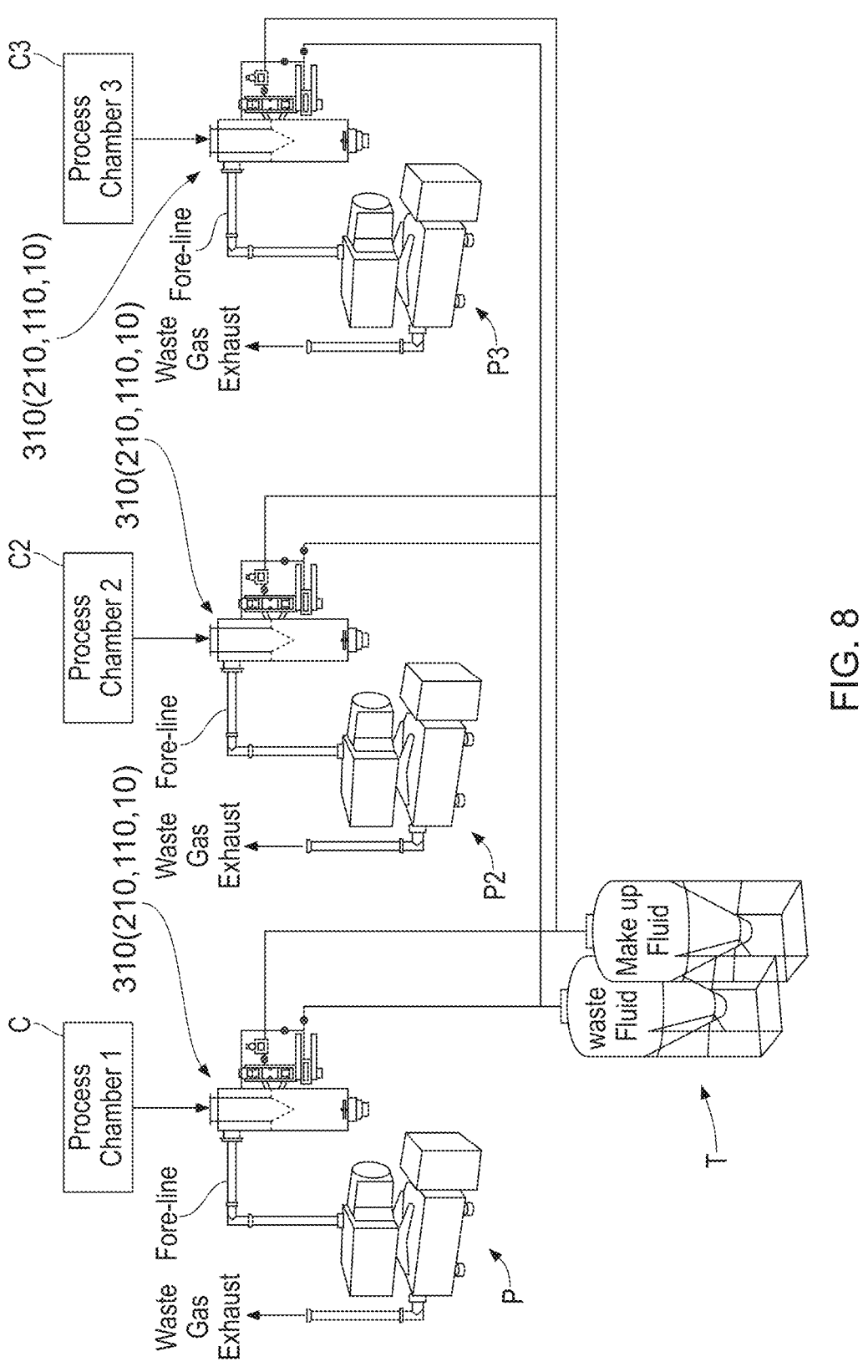
FIG. 8 is a schematic drawing of a liquid filter apparatus illustrating the liquid filter apparatus forming a multiple chamber installation for a semiconductor processing system.

Referring to FIGS. 7 and 8, filter apparatus 310 (or any of the other filter apparatuses 410, 210, 110, or 10 described herein) may be installed in the fore-line between a semiconductor processing chamber C and a processing pump P, and further installed in a system with multiple chambers (C, C2, C3) and multiple pumps (P, P2, P3), with the waste fluid from each of the filter apparatuses optionally directed to a shared waste tank T, and optionally with the make-up fluid supplied from a shared make-up fluid supply tank T.

In any of the embodiments, the control system may include one or more sensors (not shown in each embodiment), which may be used to detect the level of the filter liquid or measure the opacity (optical torpidity) or other characteristic of the liquid, which may be used to indicated that the liquid has reached a certain level of absorption. Or both types of sensors may be used—one measuring the filter liquid height and the other measuring the characteristic of the liquid. In either or both cases, the control system may be used to adjust the flow of filter fluid into and out of the apparatus based on the one or more sensors to accommodate the output of the semiconductor chamber and/or to optimize the filtering process.

Both the right angle and the in-line filter apparatus configurations may be passive ("passive" means the reservoir has a fixed amount of filter fluid that is periodically manually change and replace with new filter fluid), i.e. they are inserted in line in a semiconductor processing system using the process gas pressure and flow characteristics of the semiconductor processing system or dynamic ("dynamic" means the particle laden filter fluid is dynamically/automatically removed and exchanged with fresh filter fluid, as described above in reference to FIG. 7). As noted, the filter liquids may be removed and added periodically through the valving and optionally pump based on predetermined maintenance periods. As noted, in one configuration, a filter liquid recirculating pump may be added to recirculate the filter liquid as shown in FIG. 4. In this embodiment, the recirculating filter liquid can have very high recirculating flow rate and may be mixed more efficiently using the venturi tube as shown and described. Using a venturi tube may achieve very high particle/gas separation and, as noted, creates a localized vacuum pull on the process gases entering the filter thus assisting the process vacuum pump operation and potentially reducing its total energy consumption.

Directional terms, such as "vertical," "horizontal," "top," "bottom," "upper," "lower," "inner," "inwardly," "outer" and "outwardly," are used to assist in describing the invention based on the orientation of the embodiments shown in the illustrations. The use of directional terms should not be interpreted to limit the invention to any specific orientation(s).

The above description is that of current embodiments of the invention. Various alterations and changes can be made without departing from the spirit and broader aspects of the invention as defined in the appended claims, which are to be interpreted in accordance with the principles of patent law including the doctrine of equivalents. This disclosure is presented for illustrative purposes and should not be interpreted as an exhaustive description of all embodiments of the invention or to limit the scope of the claims to the specific elements illustrated or described in connection with these embodiments. For example, and without limitation, any individual element(s) of the described invention may be replaced by alternative elements that provide substantially similar functionality or otherwise provide adequate operation. This includes, for example, presently known alternative elements, such as those that might be currently known to one skilled in the art, and alternative elements that may be developed in the future, such as those that one skilled in the art might, upon development, recognize as an alternative. The present invention is not limited to only those embodiments that include all of these features or that provide all of the stated benefits, except to the extent otherwise expressly set forth in the issued claims. Any reference to claim elements in the singular, for example, using the articles "a," "an," "the" or "said," is not to be construed as limiting the element to the singular.

I claim:

1. A liquid filter apparatus for semiconductor process waste, said liquid filter apparatus comprising:

a housing having a filter chamber, a process waste inlet for communication with a source of semiconductor process waste gasses or plasma with a temperature in a range of 200-600 degrees C., a process waste outlet, and a feed tube being in communication with said process waste inlet and extending into said filter chamber, said feed tube having a feed tube outlet, said filter chamber forming a liquid reservoir holding a chemically inert filter liquid with a vapor pressure below approximately 10-7 torr therein, said feed tube outlet being above the liquid filter, and said process waste outlet in communication with said filter chamber; and a thermal shield interposed between the filter liquid and said feed tube outlet and above the filter liquid, said thermal shield being adjacent the feed tube outlet and being configured to deflect the semiconductor process waste as it exits the feed tube outlet to prevent direct impingement of the semiconductor process waste flowing from the feed tube with the filter liquid and further forming a volume into which the semiconductor process waste flows from said feed tube outlet to absorb heat from the semiconductor process waste prior to the semiconductor process waste flowing into the filter liquid.

2. The liquid filter apparatus according to claim 1, wherein said thermal shield is formed by a stainless steel plate to absorb heat from the semiconductor process waste.

3. The liquid filter apparatus according to claim 2, wherein said stainless steel plate is imperforate.

4. The liquid filter apparatus according to claim 1, wherein said feed tube includes an open distal end, said open distal end forming said feed tube outlet.

5. The liquid filter apparatus according to claim 1, wherein said feed tube outlet has a diameter, said thermal shield having an outer perimeter, and said outer perimeter of said thermal shield being greater than said diameter of said feed tube outlet.

6. The liquid filter apparatus according to claim 1, wherein said housing includes an exhaust chamber between said liquid reservoir and said process waste outlet to direct the flow of filtered semiconductor process waste from said liquid reservoir to said process waste outlet.

7. The liquid filter apparatus according to claim 6, wherein said housing includes an internal conduit in fluid communication with said liquid reservoir and said exhaust chamber to direct the flow of filtered semiconductor process waste from said liquid reservoir to said exhaust chamber.

8. The liquid filter apparatus according to claim 1, further comprising a filter liquid control system for controlling the filter liquid flow into and out of said liquid reservoir.

9. The liquid filter apparatus according to claim 8, wherein said filter liquid control system comprises a controller and a fluid circuit, said controller controlling said fluid circuit to regulate the flow of filter liquid into and out of said liquid reservoir.

10. The liquid filter apparatus according to claim 8, further comprising at least one support to support said thermal shield above the filter liquid in said liquid reservoir.

11. A liquid filter apparatus for semiconductor process waste, said liquid filter apparatus comprising:

a housing having a filter chamber, a process waste inlet for communication with a source of semiconductor process waste gasses or plasma with a temperature in a range of 200-600 degrees C., a process waste outlet, and a feed tube in communication with said process waste inlet and said filter chamber, said feed tube having a feed tube outlet, said filter chamber forming a liquid reservoir holding a chemically inert filter liquid with a vapor pressure below approximately $10^{-7}$ torr therein, and said process waste outlet in communication with said filter chamber;

a deflecting surface interposed between the filter liquid and said feed tube outlet and above the filter liquid, said deflecting surface being adjacent the feed tube outlet to deflect the semiconductor process waste as it exits the feed tube outlet to prevent direct impingement of the semiconductor process waste flowing from the feed tube with the filter liquid and further absorbing heat from the semiconductor process waste prior to the semiconductor process waste flowing into the filter liquid; and a thermal shield, said thermal shield including a cup-shaped body, and said cup-shaped body forming said deflecting surface and forming a first volume into which the semiconductor process waste flows from said feed tube.

12. The liquid filter apparatus according to claim 11, wherein said cup-shaped body has a cylindrical wall spaced from said feed tube.

13. The liquid filter apparatus according to claim 11, wherein said cup-shaped body comprises a first cup-shaped body, and said thermal shield further including a second cup-shaped body, said first cup-shaped body located in said second cup-shaped body, said second cup-shaped body forming a second volume into which the semiconductor process waste flows from said first cup-shaped body and from which the semiconductor process waste flows to said process waste outlet.

14. The liquid filter apparatus according to claim 13, wherein said thermal shield further comprising a third cup-shaped body, said third cup-shaped body located in said second cup-shaped body spaced from said first cup-shaped body, said third cup-shaped body forming a third volume into which the semiconductor process waste flows and from which the semiconductor process waste flows to said process waste outlet.

15. The liquid filter apparatus according to claim 14, wherein said cup-shaped bodies are stainless steel bodies.

16. A method of separating solids from semiconductor process waste in a semiconductor processing system using a liquid filter, said method comprising the steps of:

providing a liquid filter apparatus of claim 11;

providing an indirect pre-filter fluid pathway from the feed tube outlet to the liquid reservoir;

absorbing energy from the semiconductor process waste in the indirect pre-filter fluid pathway; and directing the semiconductor process waste into the indirect pre-filter fluid pathway of the filter chamber from the feed tube to reduce the heat in the semiconductor process waste; and thereafter directing the semiconductor process waste into the liquid reservoir of the filter chamber.

17. The method according to claim 16, wherein said directing the semiconductor process waste into the indirect pre-filter fluid pathway includes spacing the deflecting surface from the feed tube outlet.

18. The method according to claim 17, further comprising sizing the deflecting surface greater than the diameter of the feed tube outlet.

19. The method according to claim 17, further comprising supporting the deflecting surface above the filter liquid in the liquid reservoir.

20. The method according to claim 19, further comprising maintaining the filter liquid in the liquid reservoir at a liquid level below the deflecting surface.

21. The method according to claim 17, further providing a heat sink, and spacing the heat sink from the feed tube outlet.

* * * * *